US009312242B2

(12) United States Patent
Mu et al.

(10) Patent No.: US 9,312,242 B2
(45) Date of Patent: Apr. 12, 2016

(54) DENSE-PITCH SMALL-PAD COPPER WIRE BONDED DOUBLE IC CHIP STACK PACKAGING PIECE AND PREPARATION METHOD THEREFOR

(71) Applicants: TIANSHUI HUATIAN TECHNOLOGY CO., LTD, Tianshui (CN); HUATIAN TECHNOLOGY (XI'AN) CO., LTD., Xi'an (CN)

(72) Inventors: Wei Mu, Tianshui (CN); Xizhou Li, Tianshui (CN); Xiaowei Guo, Tianshui (CN)

(73) Assignees: TIANSHUI HUATIAN TECHNOLOGY CO., LTD, Tianshui (CN); HUATIAN TECHNOLOGY (XI'AN) CO., LTD., Xi'an (CN)

( * ) Notice: Subject to any disclaimer, the term of this patent is extended or adjusted under 35 U.S.C. 154(b) by 9 days.

(21) Appl. No.: 14/363,996

(22) PCT Filed: Sep. 27, 2012

(86) PCT No.: PCT/CN2012/082169
§ 371 (c)(1),
(2) Date: Nov. 10, 2014

(87) PCT Pub. No.: WO2013/082970
PCT Pub. Date: Jun. 13, 2013

(65) Prior Publication Data
US 2015/0061099 A1 Mar. 5, 2015

(30) Foreign Application Priority Data
Dec. 9, 2011 (CN) .......................... 2011 1 0408630

(51) Int. Cl.
*H01L 25/065* (2006.01)
*H01L 23/495* (2006.01)
(Continued)

(52) U.S. Cl.
CPC ........ *H01L 25/0657* (2013.01); *H01L 23/4952* (2013.01); *H01L 23/49575* (2013.01);
(Continued)

(58) Field of Classification Search
CPC .......... H01L 2224/48227; H01L 2224/73265; H01L 2224/32145; H01L 2224/48091; H01L 2224/45147; H01L 2224/48145; H01L 25/0657; H01L 2224/48247; H01L 2224/48465; H01L 2224/16145; H01L 2225/0651; H01L 24/49
See application file for complete search history.

(56) References Cited

FOREIGN PATENT DOCUMENTS

| CN | 101599483 | 12/2009 |
|----|-----------|---------|
| CN | 101626008 | 1/2010  |

(Continued)

*Primary Examiner* — Roy Potter
(74) *Attorney, Agent, or Firm* — Hamre, Schumann, Mueller & Larson, P.C.

(57) ABSTRACT

A dense-pitch small-pad copper wire bonded double IC chip stack package comprises a plastic package body, in which a lead frame carrier and a frame lead inner pin are arranged; the upper surface of the lead frame carrier is fixedly connected with a first IC chip; a second IC chip is stacked on the first IC chip; the upper surface of the first IC chip and the upper surface of the second IC chip are respectively provided with a plurality of pads which are arranged as two lines of pad groups in parallel; the two pad groups are respectively a first pad group and a second pad group; a metal ball is implanted on each pad; each metal ball is connected with a first copper bonding ball; and a third copper bonding wire is formed by looping and arching on a corresponding metal ball between the second IC chip and the first IC chip. The preparation process of the present invention comprises thinning, scribing, loading the chip, performing pressure welding, plastic packaging and post-curing, trimming, electroplating, printing, forming and separating, and packaging. The package and the preparation method of the invention avoid the hidden danger of open circuit of a plastic packaging punching wire caused by the crater on the pad, the short circuit of adjacent welding spots, and the easy damage of a previous wire.

6 Claims, 3 Drawing Sheets

(51) Int. Cl.
*H01L 25/00* (2006.01)
*H01L 23/31* (2006.01)
*H01L 23/00* (2006.01)

(52) U.S. Cl.
CPC ............... *H01L24/85* (2013.01); *H01L 24/97* (2013.01); *H01L 25/50* (2013.01); *H01L 23/3107* (2013.01); *H01L 24/05* (2013.01); *H01L 24/06* (2013.01); *H01L 24/32* (2013.01); *H01L 24/45* (2013.01); *H01L 24/48* (2013.01); *H01L 24/49* (2013.01); *H01L 24/73* (2013.01); *H01L 24/75* (2013.01); *H01L 2224/04042* (2013.01); *H01L 2224/05554* (2013.01); *H01L 2224/06135* (2013.01); *H01L 2224/32145* (2013.01); *H01L 2224/32245* (2013.01); *H01L 2224/45015* (2013.01); *H01L 2224/45147* (2013.01); *H01L 2224/48145* (2013.01); *H01L 2224/48247* (2013.01); *H01L 2224/48464* (2013.01); *H01L 2224/49109* (2013.01); *H01L 2224/49175* (2013.01); *H01L 2224/73265* (2013.01); *H01L 2224/75704* (2013.01); *H01L 2224/75745* (2013.01); *H01L 2224/92247* (2013.01); *H01L 2224/97* (2013.01); *H01L 2225/0651* (2013.01); *H01L 2225/06506* (2013.01)

(56) References Cited

FOREIGN PATENT DOCUMENTS

| | | |
|---|---|---|
| CN | 102437147 | 5/2012 |
| CN | 202339914 | 7/2012 |

DENSE-PITCH SMALL-PAD COPPER WIRE BONDED DOUBLE IC CHIP STACK PACKAGING PIECE AND PREPARATION METHOD THEREFOR

FIELD OF THE INVENTION

The present invention belongs to the field of electronic information automation component and part manufacturing technology, and relates to an IC chip package, and in particular, to a dense-pitch small-pad copper wire bonded double IC chip stack package. The present invention further relates to a preparation method of the package.

BACKGROUND OF THE INVENTION

With the rapid development of the electronic information industry, a chip manufacturing industry moves into a nanometer times. A chip manufacturing process size is reduced from 90 nm to 45 nm, and then to 30 nm and 13 nm, which is quickly progressed. The physical dimension of the chip is more and more small, which is from 1.0 mm×1.0 mm to 0.8 mm×0.8 mm, 0.5 mm×0.5 mm, 0.3 mm×0.3 mm, and minimum 0.15 mm×0.15 mm. Accordingly, the pitch of the pad used for chip manufacturing is gradually reduced from 120 μm to 100 μm, 70 μm, 60 μm, 50 μm and 45 μm. and a scribing channel is also gradually reduced from 100 μm to 70 μm, 60 μm, 504 μm and 45 μm. Therefore, the size of the pad is also gradually reduced from 100 μm×100 μm originally to 70 μm×70 μm, 55 μm×55 μm, and minimum 38 μm×38 μm. The size change of the pad brings difficulty and great challenge for the bonding process.

In a normal ball welding binding process, the qualified diameter of a welded ball is larger than/equal to 2 times of a wire diameter, and smaller than 5 times of the wire diameter. Generally, the diameter of a metal wire welded ball can be controlled at 2~2.3 (times) of the wire diameter, and the diameter of a copper wire welded ball can be controlled at 2.5~3 (times) of the wire diameter. For 38 μm×38 μm pads, the pitch of the adjacent pads is 41 μm~43 μm, and a phi 15 μm~phi 16 μm welding wire can be used only; moreover, the diameter of the bonding welded ball must be controlled within 37 μm. In this way, whether the phi 15 μm (2.3× 15=34.5<37) metal wire or the upper limit phi 16 μm (16× 2.3=36.8<37) metal wire can meet the pressure welding requirements. While whether the phi 15 μm (taking the lower limit 15×2.5=37.5>37), or the phi 16 μm (taking the upper limit 16×2.5=40>37) copper wire does not meet the pressure welding requirements. Moreover, from the view of pressure welding quality inspection, the clearance between adjacent bonding wires shall be equal to 2 times of the diameter of the welding wire. Actually, the distance between the two adjacent bonding wires cannot meet general quality requirements even if the wire diameter is removed and the clearance between the adjacent bonding wires is 1.69~1.86 times of the wire diameter. However, practice proves that with the improvement of the quality of the welding wire, increasing of wire diameter specifications, development of packaging technology and increasing of high density packaging forms and products, under the premise of ensuring that the plastic packaging punching wire rate meets the technical requirement, it is also accepted to meet the welding wire technical requirement by the industry when no short circuit exists between the welding wires and the clearance between adjacent leaders is larger than 1 times of the wire diameter. However, for dense-pitch small-pad bonding, it is very difficult to control the diameter of a bonding wall. A little carelessness may make the bonding ball exceed the pad to cause short circuit between adjacent welding spots and lead to product abandon. Moreover, since the wire spacing is too small, a previous wire will be hit when a second wire is punched to cause damage of the previous wire. So, the biggest difficulty for bonding a dense-pitch small-pad product having a pitch less than 43 μm (38 μm×38 μm) lies in the problems of controlling the diameter of the welded ball at the bonding spot and damaging the adjacent welding wires by hit.

SUMMARY OF THE INVENTION

The present invention aims at solving the problems of short circuit between adjacent welding spots and damage of adjacent welding wires by hit existed in bonding the present dense-pitch small-pad IC chip having a pitch no more than 43 μm (38 μm×38 μm), and provides a dense-pitch small-pad copper wire bonded double IC chip stack package which is difficult to cause short circuit between adjacent welding spots. Another objective of the present invention is to provide a preparation method of the foregoing package, which can control the diameter of the bonding ball during a bonding process, and can avoid the adjacent welding wires from damage due to hit, and realize multi-chip stack and bonding packaging.

The present invention adopts the following technical solution to solve the technical problems.

A dense-pitch small-pad copper wire bonded double IC chip stack package comprises a plastic package body, in which a lead frame carrier and a frame lead inner pin are arranged. The upper surface of the lead frame carrier is fixedly connected with a first IC chip. A second IC chip is stacked on the first IC chip. The upper surface of the first IC chip and the upper surface of the second IC chip are respectively provided with a plurality of pads which are arranged as two lines of pad groups in parallel. The two pad groups are respectively a first pad group and a second pad group. A metal ball is implanted on each pad. Each metal ball is connected with a first copper bonding ball. And a third copper bonding wire is formed by looping and arching on a corresponding metal ball between the second IC chip and the first IC chip.

The first pad group and the second pad group are respectively welded with one metal ball on the spaced pads. The metal ball in the first pad group and the metal ball in the second pad group are alternatively arranged. A first copper bonding ball is welded on each metal ball. A second bonding ball is respectively welded on the pad not welded with the metal ball in each line of pad group. Moreover, a copper bonding spot is punched on the corresponding frame lead inner pin to form a second copper bonding wire.

A clearance is reserved between two adjacent pads in each line of pad group. The size of the pad is 38 μm×38 μm, and the pitch of the pad is 43 μm.

The first copper bonding ball is manufactured by a phi 15 μm copper wire, and the diameter of the first copper bonding ball is 35 μm 38 μm.

The second copper bonding ball is manufactured by a phi 15 μm copper wire, and the diameter of the second copper bonding ball is 34 μm 37 μm.

The diameter of the metal ball is 30 μm 36.8 μm.

The package is carried out according to the processing steps as follows:

Step 1: Thin and Scribe

Thin a wafer to 210 μm through a conventional method and scribe.

Step 2 a) Load the chip for the first time

Adopt a lead frame with a carrier not exposed to fix the thinned and scribed first IC chip on the lead frame carrier, and collect the first IC chips into a transfer box after all the first IC chips are adhered in sequence.

b) Load the chip for the second time

Feed the transfer box in which all the first IC chips are adhered to a loading machine which ascends to a set position automatically. Transfer one chip to the center of a machine table. Fix the chip through an orbit pressing plate. Dispense an insulating adhesive on the first IC chip. Absorb and place the first IC chip on the insulating adhesive, and collect the first IC chips into the transfer box after all the first IC chips are adhered in sequence.

c) Bake

Adopting N2 having an air flow of 25 μml/min~30 μml/min to bake for 3 h, wherein a baking temperature is 150° C.

Step 3: Perform Pressure Welding a) Arrange two lines of pad groups on the upper surface of the first IC chip installed in step 1 in parallel, wherein the two lines of pad groups respectively consist of pads having the same quantity, and the pads in the two lines of pad groups are not contacted mutually. The pads in one line of pad groups are corresponding to the pads in the other line of pad groups one by one. The length of each side of the pad is 38 μm×38 μm. The pitch between the pads is 43 μm. The clearance between the two adjacent pads is 5 μm.

b) Implant a metal ball

Fix a metal wire axis having a diameter of 15 μm on a pressure welding table. Feed the lead frame carrier adhered with the first IC chip onto an orbit. Preheat the lead frame carrier to 210° C., and transfer the lead frame carrier to the pressure welding table. Fix the lead frame carrier through an orbit pressing plate. Respectively implant the metal ball on the pad between the second IC chip and the first IC chip, and then collect the chips to the transfer box.

c) Stack a copper ball and punch a spot through looping

Feed a stack package semifinished product implanted with the metal ball and the transfer box to a copper wire ball welding bonding table. Fix the copper wire axis having a diameter of 15 μm on the pressure welding table. Transfer the lead frame carrier implanted with the metal ball onto the orbit after threading. Preheat the lead frame carrier to 200° C., and then transfer the lead frame carrier to a pressure welding fixture. Fix the lead frame carrier through an orbit pressing plate. Stack a first copper bonding ball on each metal ball. Upwards loop and arch to stack one first copper bonding ball on the pad implanted with the metal ball on the first IC chip to form a third copper bonding wire.

d) Directly bond the pad not implanted with the metal ball through a copper wire Directly punch one second bonding ball on each pad not implanted with the metal ball on the second IC chip and the first IC chip in sequence. Loop and arch to punch a copper welding spot on the lead frame inner pin corresponding to the pad to form the second copper bonding wire.

e) Repeat actions

Directly punch one second bonding ball on each pad not implanted with the metal ball on the second IC chip and the first IC chip in sequence. Loop and arch to punch a copper welding spot on the lead frame inner pin corresponding to the pad to form the second copper bonding wire.

Step 4: perform plastic packaging on the semifinished frame formed after pressure welding, adopt multiple-section molding wire-deformation prevention and delamination resistance process having a wire-deformation rate less than 8%, and then perform post-curing, printing, punching separation or cutting separation (QFN/QFN) through a conventional method to prepare a dense-pitch small-pad copper wire bonded IC chip package product.

A multiple-ball welding method is adopted for the package of the present invention. To be specific, a metal ball is firstly implanted on an IC chip pad; moreover, a copper bonding ball is welded on the metal ball and a structure of the copper bonding ball is directly welded on rest pads, thus avoiding the crater on the pad and a short circuit of adjacent welding spots, which not only solves the problem of an open circuit of a plastic packaging punching wire caused by ease damage of a previous wire during dense-pitch small-pad high density bonding, but also avoids the difficulty of a short circuit of adjacent welding spots due to oversize of the diameter of the bonding ball. The package has simple and rational structure, and can be used for multi-pin packaging. The present invention may further be extended to other high end packaging forms, to realize of using a copper wire to replace a metal wire for bonding, which has a bonding intensity better than that of the metal wire, thus reducing the plastic packaging punching wire rate, improving the product quality, saving the welding wire cost, and having excellent economic benefits and social benefits. The present invention is both applicable to a form with a carrier exposed or not exposed.

DETAILED DESCRIPTION OF THE EMBODIMENTS

Figure 1:
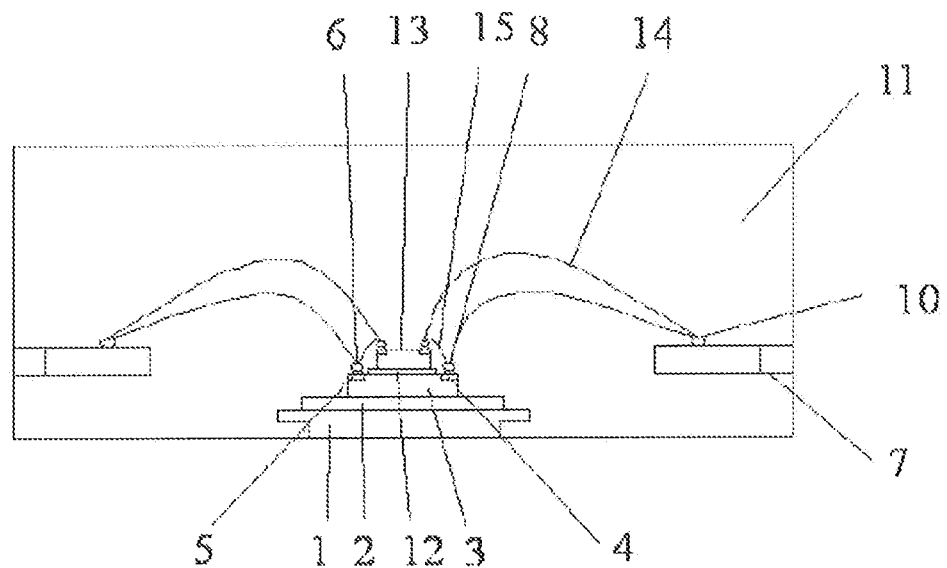
FIG. 1 is a structure view of the present invention.
Figure 2:
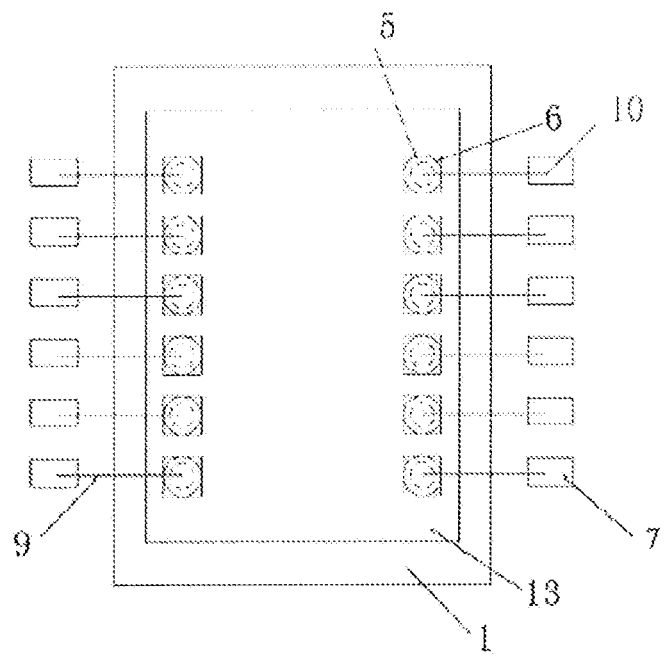
FIG. 2 is a plane schematic view of implanting a metal ball for each chip pad.

The present invention will be described hereinafter with reference to the drawings and detailed embodiments.

A dense-pitch small-pad copper wire bonded double IC chip stack package comprises a plastic package body 11, in which a lead frame carrier 1 and a frame lead inner pin 7 are arranged. The upper surface of the lead frame carrier 1 is fixedly connected with a first IC chip 3 through a chip adhesive 2. A second IC chip 13 is stacked on the first IC chip 3 through an insulating adhesive 12. The upper surface of the first IC chip 3 and the upper surface of the second IC chip 13 are respectively provided with a plurality of pads 4 which are arranged as two lines of pad groups in parallel. The two pad groups are respectively a first pad group and a second pad group. A metal ball is implanted on each pad 4. Each metal ball 5 is connected with a first copper bonding ball 6. A third copper bonding wire 15 is formed by looping and arching on a corresponding metal ball 5 between the second IC chip 13 and the first IC chip 3.

A second embodiment of the present invention is: the first pad group and the second pad group are respectively welded with one metal ball 5 on the spaced pads 4. The metal ball in the first pad group and the metal ball 5 in the second pad group are alternatively arranged. A first copper bonding ball 6 is welded on each metal ball 5 and a second bonding ball 8 is respectively welded on the pad 4 not welded with the metal ball 5 in each line of pad group. Moreover, a copper bonding spot 10 is punched on the corresponding frame lead inner pin 7 to form a second copper bonding wire 14. The foregoing components are packaged in a packaging body 11 to form an entire circuit, and play a role of protection on the metal ball 5, the first copper bonding ball 6, the second copper bonding ball 8, the second bonding wire 14, the third copper bonding wire 15 and the crescent copper welding spot 10.

The metal ball 5 of the present invention is manufactured by a copper wire having a diameter of 15 μm~16 μm. The first copper bonding ball 6 and the second copper bonding ball 8 are manufactured by a copper wire having a diameter of 15 μm. The diameter of the first copper bonding ball 6 is 35 μm~37 μm. The diameter of the second copper bonding ball 8 is 36 μm~38 μm. The present invention will be described in details with reference to the embodiments.

Embodiment 1

1. Load the chip

1) Thin and scribe

Adopt related packaging form thinning standard equipment and process to thin a wafer to 210 μm through a conventional method and scribe.

2) Load the chip for the first time

Adopt eSOP, eMSOP, eTSSOP, eL/TQFP, QFN and DFN lead frame with a carrier exposed to fix the thinned and scribed first IC chip 3 to 210 μm on the lead frame carrier 1 through a chip adhesive 2, and collect the first IC chips 3 into a transfer box after all the first IC chips are adhered in sequence.

3) Load the chip for the second time

Feed the transfer box in which all the first IC chips 3 are adhered to the feeding position of a loading machine which ascends to a set position automatically. Transfer one chip to the center of a machine table. Fix the chip through an orbit pressing plate. Dispense an insulating adhesive 12 on the first IC chip 3. An automatic suction nozzle of the loading machine automatically absorb and place the first IC chip on the insulating adhesive 12. Collect the first IC chips into the transfer box after all the first IC chips are adhered in sequence. The loading machine and process are the same with that for producing conventional products of related packaging forms.

4) Bake

Use an ESPEC oven, and adopt N2 having an air flow of 30 μml/min to bake for 3 h, wherein a baking temperature is 150° C.

2. Perform pressure welding

Figure 3:
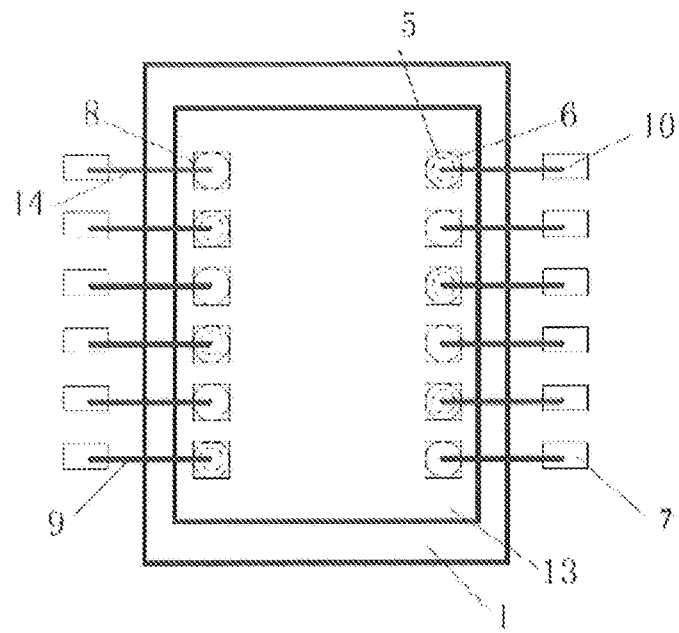
FIG. 3 is a plane schematic view of implanting a metal ball for a spaced pad.
Figure 4:
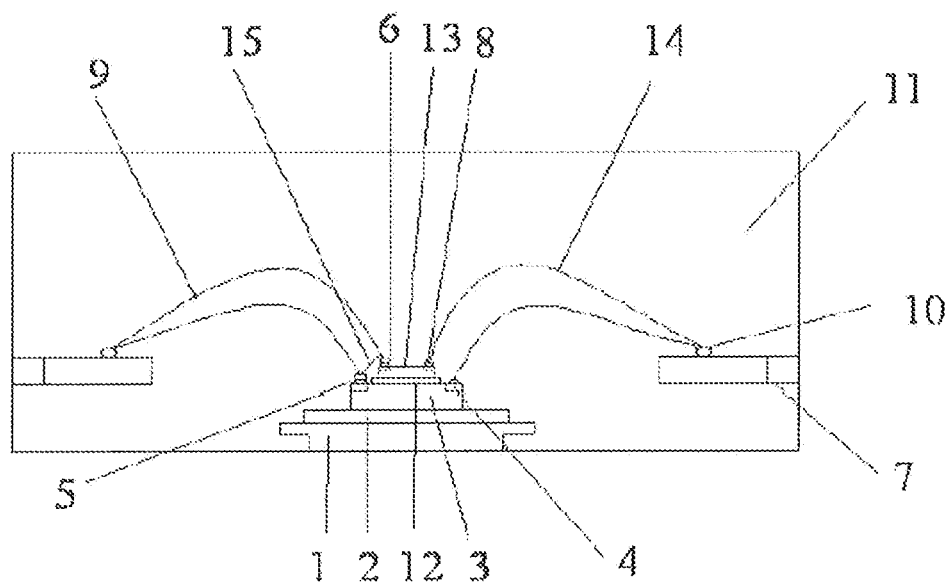
FIG. 4 is a sectional view of implanting a metal ball for a spaced pad.
Figure 5:
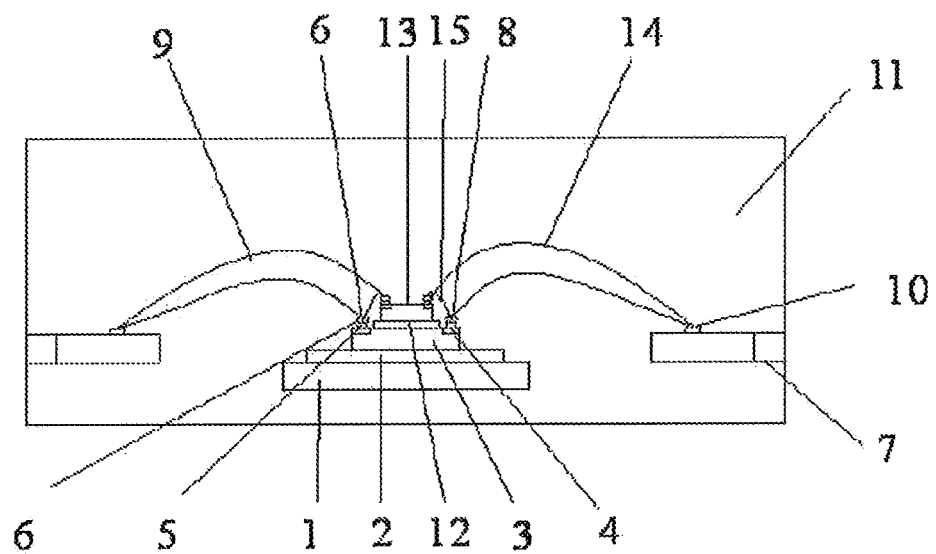
FIG. 5 is a schematic view of a carrier not exposed of the present invention.
Figure 6:
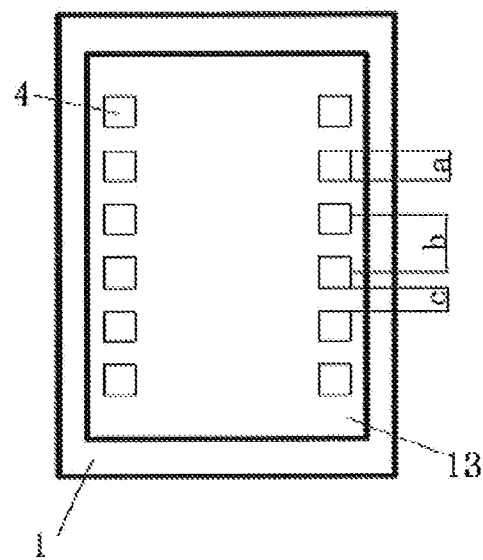
FIG. 6 is a schematic view for size and spacing of a chip pad of the present invention.

1) Arrange two lines of pad groups on the upper surface of the first IC chip 3 installed in step 1 in parallel, wherein the two lines of pad groups respectively consist of pads 4 having the same quantity, and the pads 4 in the two lines of pad groups are not contacted mutually. The pads 4 in one line of pad groups are corresponding to the pads 4 in the other line of pad groups one by one. As shown in FIG. 3, the length of each side a for controlling the pad is 38 μm×38 μm. The pitch b between the pads 4 is 43 μm. The clearance c between the two adjacent pads 4 is 5 μm.

2) Implant a metal ball

Fix a metal wire axis having a diameter of 15 μm on a pressure welding table. Feed the lead frame carrier 1 adhered with an IC chip 3 onto an orbit after threading. Preheat the lead frame carrier to 200° C. Transfer the lead frame carrier to the pressure welding table. Fix the lead frame carrier through an orbit pressing plate. Respectively implant the metal ball 5 on the pad 4 between previous IC chip and the IC chip 3, and then collect the chips to the transfer box.

3) Stack a copper ball and punch a spot through looping

Feed a stack package semifinished product implanted with the metal ball and the transfer box to a copper wire ball welding bonding table. Fix the copper wire axis having a diameter of 15 μm on the pressure welding table. Transfer the lead frame carrier 1 implanted with the metal ball 5 onto the orbit automatically after threading. Preheat the lead frame carrier to 200° C., and then transfer the lead frame carrier to a pressure welding fixture. Fix the lead frame carrier through an orbit pressing plate. Stack a first copper bonding ball 6 on the metal ball 5 of an IC 13. Upwards loop and arch to stack one first copper bonding ball 6 on the pad 4 implanted with the metal ball on the IC 13 to form a third copper bonding wire 15.

4) Directly bond the pad not implanted with the metal ball through a copper wire Directly punch one second bonding ball 8 on each pad 4 not implanted with the metal ball on the previous IC chip and the IC chip 3. Loop and arch to punch a crescent copper welding spot 10 on the lead frame inner pin 7 corresponding to the pad 4 to form the second copper bonding wire 14.

5) Repeat actions

Directly punch one second copper bonding ball 8 on each pad 4 not implanted with the metal ball 5 on the second IC chip 13 and the first IC chip 3. Loop and arch to punch a crescent copper welding spot 10 on the lead frame inner pin 7 corresponding to the pad 4 to form the second copper bonding wire 14.

3. Perform plastic packaging on the semifinished frame formed after pressure welding. Preferably select a combination scheme of environment friendly ordinary material and adhesive through combined DOE comparison tests of three groups of environment friendly materials and three groups of ordinary materials respectively. Adopt multiple-section molding wire-deformation prevention (a wire-deformation rate is less than 8%) and delamination resistance process and then perform post-curing, printing, punching separation or cutting separation (QFN/QFN) according to a conventional method to prepare a dense-pitch small-pad copper wire bonded IC chip package product.

Embodiment 2

1. Load the chip

1) Thin and scribe

Adopt related packaging form thinning standard equipment and process to thin a lower wafer to 210 μm and an upper wafer to 150 μm through a conventional method and scribe.

2) Load the chip for the first time

Adopt eSOP, eMSOP, eTSSOP, eL/TQFP, QFN and DFN lead frame with a carrier exposed to fix the thinned and scribed first IC chip 3 to 210 μm on the lead frame carrier 1 through a conductive adhesive 2 and collect the first IC chips 3 into a transfer box after all the first IC chips are adhered in sequence.

3) Load the chip for the second time

Feed the transfer box in which all the first IC chips 3 are adhered to the feeding position of a loading machine which ascends to a set position automatically. Transfer one chip to the center of a machine table. Fix the chip through an orbit pressing plate. Dispense an insulating adhesive 12 on the first IC chip 3. An automatic suction nozzle of the loading machine automatically absorb and place the second IC chip 13 (the thickness of the chip is 150 μm) on the insulating adhesive 12. Collect the second IC chips into the transfer box after all the second IC chips 13 are adhered in sequence. The loading machine and process are the same with that for producing conventional products of related packaging forms.

4) Bake

Use an ESPEC oven, and adopt N2 having an air flow no less than 25 μml/min to bake for 3 h, wherein a baking temperature is 150° C.

2. Perform pressure welding

1) Arrange two lines of pad groups (chip manufacturing) on the upper surface of the first IC chip 3 installed in step 1 in parallel, wherein the two lines of pad groups respectively consist of pads 4 having the same quantity, and the pads 4 in the two lines of pad groups are not contacted mutually. The pads 4 in one line of pad groups are corresponding to the pads 4 in the other line of pad groups one by one. As shown in FIG. 3, the length of each side a for controlling the pad is 38 μm×38 μm. The pitch b between the pads 4 is 43 μm. The clearance c between the two adjacent pads 4 is 5 μm.

2) Implant a metal ball

Fix a metal wire axis having a diameter of 15 μm on a pressure welding table. Feed the lead frame carrier 1 adhered with the first IC chip 3 automatically onto an orbit after threading. Preheat the lead frame carrier to 200° C. Transfer the lead frame carrier to the pressure welding table. Fix the lead frame carrier through an orbit pressing plate. Respectively implant the metal ball 5 on the pad 4 between the second IC chip 13 and the first IC chip 3 (as shown in FIG. 10), and then collect the chips to the transfer box.

3) Stack a copper ball and punch a spot through looping

Feed a stack package semifinished product implanted with the metal ball 5 and the transfer box to a copper wire ball welding bonding table. Fix the copper wire axis having a diameter of 15 μm on the pressure welding table. Transfer the lead frame carrier 1 implanted with the metal ball 5 onto the orbit automatically after threading. Preheat the lead frame carrier to 200° C., and then transfer the lead frame carrier to a pressure welding fixture. Fix the lead frame carrier through an orbit pressing plate. Stack a first copper bonding ball 6 on the metal ball 5 of the IC 13. Upwards loop and arch to stack one first copper bonding ball 6 on the pad 4 implanted with the metal ball 5 on the IC 13 to form a third copper bonding wire 15.

4) Directly bond the pad not implanted with the metal ball through a copper wire Directly punch one second bonding ball 8 on each pad 4 not implanted with the metal ball on the second IC chip 13 and the first IC chip 3. Loop and arch to punch a crescent copper welding spot 10 on the lead frame inner pin 7 corresponding to the pad 4 to form the second copper bonding wire 14.

5) Repeat actions

Directly punch one second bonding ball 8 on each pad 4 not implanted with the metal ball on the second IC chip 13 and the first IC chip 3. Loop and arch to punch a crescent copper welding spot 10 on the lead frame inner pin 7 corresponding to the pad 4 to form the second copper bonding wire 14.

3. Perform plastic packaging on the semifinished frame formed after pressure welding. Preferably select a combination scheme of environment friendly ordinary material and adhesive through combined DOE comparison tests of three groups of environment friendly materials and three groups of ordinary materials respectively. Adopt multiple-section molding wire-deformation prevention (a wire-deformation rate is less than 8%) and delamination resistance process and then perform post-curing, printing, punching separation or cutting separation (QFN/QFN) according to a conventional method to prepare a dense-pitch small-pad copper wire bonded IC chip package product.

Embodiment 3

1. Load the chip

1) Thin and scribe

Adopt related packaging form thinning standard equipment and process to thin a wafer to 210 μm through a conventional method and scribe.

2) Load the chip for the first time

Adopt SOP, MSOP, SSOP, TSSOP, QFP, L/TQFP, QFN, DFN lead frame with a carrier not exposed to fix the thinned and scribed first IC chip 3 to 210 μm on the lead frame carrier 1 through an insulating adhesive 2 and collect the first IC chips 3 into a transfer box after all the first IC chips are adhered in sequence.

3) Load the chip for the second time

Feed the transfer box in which all the first IC chips 3 are adhered to the feeding position of a loading machine which ascends to a set position automatically. Transfer one chip to the center of a machine table. Fix the chip through an orbit pressing plate. Dispense an insulating adhesive 12 on the first IC chip 3. An automatic suction nozzle of the loading machine automatically absorb and place the second IC chip on the insulating adhesive 12. Collect the first IC chips into the transfer box after all the first IC chips are adhered in sequence. The loading machine and process are the same with that for producing conventional products of related packaging forms.

4) Bake

Use an ESPEC oven to bake for 3 h through a conventional baking technique, wherein a baking temperature is 150° C.

2. Perform pressure welding

1) Arrange two lines of pad groups on the upper surface of the first IC chip 3 installed in step 1 in parallel, wherein the two lines of pad groups respectively consist of pads 4 having the same quantity, and the pads 4 in the two lines of pad groups are not contacted mutually. The pads 4 in one line of pad groups are corresponding to the pads 4 in the other line of pad groups one by one. As shown in FIG. 3, the length of each side a for controlling the pad is 38 μm×38 μm. The pitch b between the pads 4 is 43 μm. The clearance c between the two adjacent pads 4 is 5 μm.

2) Implant a metal ball

Fix a metal wire axis having a diameter of 15 μm on a pressure welding table. Feed the lead frame carrier 1 adhered with the IC chip 3 automatically onto an orbit after threading. Preheat the lead frame carrier to 210° C. Transfer the lead frame carrier to the pressure welding table. Fix the lead frame carrier through an orbit pressing plate. Respectively implant the metal ball 5 on the pad 4 between the second IC chip 13 and the first IC chip 3, and then collect the chips to the transfer box.

3) Stack a copper ball and punch a spot through looping

Feed a stack package semifinished product implanted with the metal ball 5 and the transfer box to a copper wire ball welding bonding table. Fix the copper wire axis having a diameter of 15 μm on the pressure welding table. Transfer the lead frame carrier 1 implanted with the metal ball 5 onto the orbit automatically after threading. Preheat the lead frame carrier to 200° C., and then transfer the lead frame carrier to a pressure welding fixture. Fix the lead frame carrier through an orbit pressing plate. Stack a first copper bonding ball 6 on the metal ball 5 of the IC 13. Upwards loop and arch to stack one first copper bonding ball 6 on the pad 4 implanted with the metal ball 5 on the IC 13 to form a third copper bonding wire 15.

4) Directly bond the pad not implanted with the metal ball through a copper wire Directly punch one second bonding ball 8 on each pad 4 not implanted with the metal ball on the second IC chip 13 and the first IC chip 3. Loop and arch to punch a crescent copper welding spot 10 on the lead frame inner pin 7 corresponding to the pad 4 to form the second copper bonding wire 14.

5) Repeat actions

Directly punch one second copper bonding ball 8 on each pad 4 not implanted with the metal ball 5 on the second IC chip 13 and the first IC chip 3 in sequence. Loop and arch to punch a crescent copper welding spot 10 on the lead frame inner pin 7 corresponding to the pad 4 to form the second copper bonding wire 14.

3. Perform plastic packaging on the semifinished frame formed after pressure welding. Preferably select a combination material of environment friendly ordinary material and adhesive through combined DOE comparison tests of three groups of environment friendly materials and three groups of ordinary materials respectively. Adopt multiple-section molding wire-deformation prevention (a wire-deformation rate is less than 8%) and delamination resistance process and then perform post-curing, printing, punching separation or cutting separation (QFN/QFN) according to a conventional method to prepare a dense-pitch small-pad copper wire bonded IC chip package product.

Embodiment 4

1. Load the chip

1) Thin and scribe

Adopt related packaging form thinning standard equipment and process to thin a lower wafer to 210 μm and an upper wafer to 150 μm through a conventional method and scribe.

2) Load the chip for the first time

Adopt eSOP, eMSOP, eTSSOP, eL/TQFP, QFN and DFN lead frame with a carrier exposed to fix the thinned and scribed IC chip 3 to 210 μm on the lead frame carrier 1 through an insulating adhesive 3, and collect the first IC chips 3 into a transfer box after all the first IC chips are adhered in sequence.

3) Load the chip for the second time

Feed the transfer box in which all the first IC chips 3 are adhered to the feeding position of a loading machine which ascends to a set position automatically. Transfer one chip to the center of a machine table. Fix the chip through an orbit pressing plate. Dispense an insulating adhesive 12 on the first IC chip 3. An automatic suction nozzle of the loading machine automatically absorb and place the previous IC chip (the thickness of the chip is 150 μm) on the insulating adhesive 12. Collect the second IC chips into the transfer box after all the previous IC chips are adhered in sequence. The loading machine and process are the same with that for producing conventional products of related packaging forms.

4) Bake

Use an ESPEC oven, and adopt a delamination resistance baking technology having an N2 air flow of no less than 30 μml/min to bake for 3 h, wherein a baking temperature is 150° C.

2. Perform pressure welding

1) Arrange two lines of pad groups (chip manufacturing) on the upper surface of the first IC chip 3 installed in step 1 in parallel, wherein the two lines of pad groups respectively consist of pads 4 having the same or different quantity, and the pads 4 in the two lines of pad groups are not contacted mutually. The pads 4 in one line of pad groups are corresponding to the pads 4 in the other line of pad groups one by one. As shown in FIG. 3, the length of each side a for controlling the pad is 38 μm×38 μm. The pitch b between the pads 4 is 43 μm. The clearance c between the two adjacent pads 4 is 5 μm. See FIG. 1.

2) Implant a metal ball

Fix a metal wire axis having a diameter of 15 μm on a pressure welding table. Feed the lead frame carrier 1 adhered with the IC chip 3 automatically onto an orbit after threading. Preheat the lead frame carrier to 200° C. Transfer the lead frame carrier to the pressure welding table. Fix the lead frame carrier through an orbit pressing plate. Respectively implant the metal ball 5 on the pad 4 between the previous IC chip 13 and the IC chip 3, and then collect the chips to the transfer box.

3) Stack a copper ball and punch a spot through looping

Feed a stack package semifinished product implanted with the metal ball 5 and the transfer box to a copper wire ball welding bonding table. Fix the copper wire axis having a diameter of 15 μm on the pressure welding table. Transfer the lead frame carrier 1 implanted with the metal ball 5 onto the orbit automatically after threading. Preheat the lead frame carrier to 200° C., and then transfer the lead frame carrier to a pressure welding fixture. Fix the lead frame carrier through an orbit pressing plate. Stack a first copper bonding ball 6 on the metal ball 5 of the IC 13. Upwards loop and arch to stack one first copper bonding ball 6 on the pad 4 implanted with the metal ball 5 on the IC 13 to form a third copper bonding wire 15.

4) Directly bond the pad not implanted with the metal ball through a copper wire Directly punch one second bonding ball 8 on each pad 4 not implanted with the metal ball on the previous IC chip and the IC chip 3. Loop and arch to punch a crescent copper welding spot 10 on the lead frame inner pin 7 corresponding to the pad 4 to form the second copper bonding wire 14.

5) Repeat actions

Directly punch one second copper bonding ball 8 on each pad 4 not implanted with the metal ball 5 on the previous IC chip and the IC chip 3. Loop and arch to punch a crescent copper welding spot 10 on the lead frame inner pin 7 corresponding to the pad 4 to form the second copper bonding wire 14.

3. Perform plastic packaging on the semifinished frame formed after pressure welding. Preferably select a combination scheme of environment friendly ordinary material and adhesive through combined DOE comparison tests of three groups of environment friendly materials and three groups of ordinary materials respectively. Adopt multiple-section molding wire-deformation prevention (a wire-deformation rate is less than 8%) and delamination resistance process and then perform post-curing, printing, punching separation or cutting separation (QFN/QFN) according to a conventional method to prepare a dense-pitch small-pad copper wire bonded IC chip package product.

Although the present invention is shown and described with reference to the preferred embodiments, those skilled in the art may understand that modification and transformation made without departing from the spirit and scope defined by the claims attached are allowed.

What is claimed is:

1. A dense-pitch small-pad copper wire bonded double IC chip stack package, comprising:
    a plastic package body, wherein a lead frame carrier and a frame lead inner pin are arranged in the plastic package body, an upper surface of the lead frame carrier is fixedly connected with a first IC chip;
    a second IC chip is stacked on the first IC chip, wherein an upper surface of the first IC chip is provided with a plurality of pads, and an upper surface of the second IC chip is provided with a plurality of pads, the plurality of pads on the upper surface of the first IC chip and the plurality of pads on the upper surface of the second IC chip are arranged as two lines of pad groups in parallel, the two pad groups are respectively a first pad group and a second pad group;

a metal ball is implanted on each pad, each implanted metal ball is connected with a first copper bonding ball, and a third copper bonding wire is formed by arching on a corresponding implanted metal ball between the second IC chip and the first IC chip; wherein metal balls are welded on every other pads of the first and second pad groups; the pads with welded metal balls in the first pad group correspond to the pads without welded metal balls in the second pad group, a first copper bonding ball is welded on each welded metal ball in each pad group, and a second bonding ball is welded on each pad without a welded metal ball in each pad group, and a copper bonding spot is punched on the corresponding frame lead inner pin to form a second copper bonding wire.

2. The dense-pitch small-pad copper wire bonded double IC chip stack package according to claim 1, wherein a clearance is reserved between two adjacent pads in each line of pad group; the size of the pad is 38 μm×38 μm, and the pitch of the pad is 43 μm.

3. The dense-pitch small-pad copper wire bonded double IC chip stack package according to any one of claim 1, wherein the first copper bonding ball is manufactured by a phi 15 μm copper wire, and the diameter of the first copper bonding ball is 35 μm~38 μm.

4. The dense-pitch small-pad copper wire bonded double IC chip stack package according to any one of claim 1, wherein the diameter of the metal ball is 30 μm~36.8 μm.

5. The dense-pitch small-pad copper wire bonded double IC chip stack package according to any one of claim 1, wherein the second copper bonding ball is manufactured by a phi 15 μm copper wire, and the diameter of the second copper bonding ball is 34 μm~37 μm.

6. A preparation method of a dense-pitch small-pad copper wire bonded double IC chip stack package according to claim 1, wherein the method is carried out according to the processing steps as follows:

Step 1: thinning and scribing
Thinning a wafer to 210 μm through a conventional method and scribing;

Step 2
a) Loading the chip for the first time
Adopting a lead frame with a carrier not exposed to fix the thinned and scribed first IC chip on the lead frame carrier, and collecting the first IC chips into a transfer box after all the first IC chips are adhered in sequence;

b) Loading the chip for the second time
Feeding the transfer box in which all the first IC chips are adhered to a loading machine, transferring the chip to the center of a machine table, and fixing the chip through an orbit pressing plate, dispensing an insulating adhesive on the first IC chip, absorbing and placing the first IC chip on the insulating adhesive, and collecting the first IC chip into the transfer box after all the first IC chips are adhered in sequence;

c) Baking
Adopting N2 having an air flow of 25~30ml/min to bake for 3h, wherein a baking temperature is 150° C.;

Step 3: pressure welding
a) Arranging two lines of pad groups on the upper surface of the first IC chip installed in step 1 in parallel, wherein the two lines of pad groups respectively consist of pads having the same quantity, and the pads in the two lines of pad groups are not contacted mutually; the pads in one line of pad groups are corresponding to the pads in the other line of pad groups one by one; the length of each side of the pad is 38 μm×38 μm, the pitch between the pads is 43 μm; and the clearance between the two adjacent pads is 5 μm;

b) Implanting a metal ball
Fixing a metal wire axis having a diameter of 15 μm on a pressure welding table, feeding the lead frame carrier adhered with the first IC chip onto an orbit, preheating the lead frame carrier to 210° C., and transferring the lead frame carrier to the pressure welding table, fixing the lead frame carrier through an orbit pressing plate, respectively implanting the metal ball on the pad between the second IC chip and the first IC chip, and then collecting the chips to the transfer box;

c) Stacking a copper ball and punching a spot through looping
Feeding a stack package semifinished product implanted with the metal ball and the transfer box to a copper wire ball welding bonding table, fixing the copper wire axis having a diameter of 15 μm on the pressure welding table, transferring the lead frame carrier implanted with the metal ball onto the orbit after threading, preheating the lead frame carrier to 200° C., and then transferring the lead frame carrier to a pressure welding fixture, fixing the lead frame carrier through an orbit pressing plate, stacking a first copper bonding ball on each metal ball, upwards looping and arching to stack one first copper bonding ball on the pad implanted with the metal ball on the first IC chip to form a third copper bonding wire;

d) Directly bonding the pad not implanted with the metal ball through a copper wire
Directly punching a second bonding ball on each pad not implanted with the metal ball in the pad groups on the second IC chip and the first IC chip, and looping and arching to punch a copper welding spot on a lead frame inner pin corresponding to the pad to form a second copper bonding wire;

e) Repeating actions
Directly punching one second bonding ball on each pad not implanted with the metal ball on the second IC chip and the first IC chip in sequence, and looping and arching to punch a copper welding spot on the lead frame inner pin corresponding to the pad to form the second copper bonding wire;

Step 4: performing plastic packaging on the semifinished frame formed after pressure welding, adopting multiple-section molding wire-deformation prevention and delamination resistance process having a wire-deformation rate less than 8%, and then performing post-curing, printing, punching separation or cutting separation (QFN/QFN) through a conventional method to prepare a dense-pitch small-pad copper wire bonded IC chip package product.

* * * * *